US007473896B2

(12) United States Patent
Tennant

(10) Patent No.: US 7,473,896 B2
(45) Date of Patent: Jan. 6, 2009

(54) NEGATIVE LUMINESCENCE COLD SHIELD (NLCS) WITH MICROLENSES TO MAGNIFY THE EFFECTIVE AREA OF SPARSELY POPULATED NEGATIVE LUMINESCENCE REGIONS AND METHOD OF FABRICATION

(75) Inventor: William E. Tennant, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 379 days.

(21) Appl. No.: 11/306,293

(22) Filed: Dec. 21, 2005

(65) Prior Publication Data

US 2007/0290132 A1 Dec. 20, 2007

(51) Int. Cl.
*G01J 5/20* (2006.01)
(52) U.S. Cl. .................................. 250/338.4
(58) Field of Classification Search ............... 250/338.4
See application file for complete search history.

(56) References Cited

U.S. PATENT DOCUMENTS

| | | | | |
|---|---|---|---|---|
| 5,949,081 | A * | 9/1999 | Ashley et al. | 250/493.1 |
| 6,091,069 | A * | 7/2000 | Ashley et al. | 250/352 |
| 6,359,283 | B1 * | 3/2002 | Gordon et al. | 250/370.13 |

OTHER PUBLICATIONS

J. Ryan Lindle, William W. Bewley, Igor Vurgaftman, Chul Soo Kim, Jerry R. Meyer, J.L. Johnson, Mason L. Thomas, Eric C. Piquette, and William E. Tennant; *Negative Luminescence From Large-Area HgCdTe Photodiode Arrays With 4.8-6.0-um Cutoff Wavelengths*, EE Journal of Quantum Electronics, vol. 41, No. 2, Feb. 2005, pp. 227-233.

G.R. Nash, N.T. Gordon, T. Ashley, M.T. Emeny and T.M. Burke, *Large-area IR negative luminescent devices*, IEE Proc.-Optoelectron., vol. 150, No. 4, Aug. 2003, pp. 371-375.

H.O. Sankur and M.E. Motamedi, *Microoptics development in the past decade*. In *Micromachining Technology for Micro-Optics*, Sing H. Lee, Eric G. Johnson, Editors, Proceedings of SPIE vol. 4179 (2000), pp. 30-55.

W.T. Welford and R. Winston, Chapter 4, *Nonimaging Concentrators: The Compound Parabolic Concentrator*, from *The Optics of Nonimaging Concentrators, Light and Solar Energy*, Academic Press, New York, San Francisco, London, 1978.

Gunapala, et al., "640×512 Pixels Long-Wavelength Infrared (LWIR) Quantum Dot Infrared Photodetector (QDIP) Imaging Focal Plane Array", Pro. of SPIE vol. 6361, 636116 (2006).

* cited by examiner

*Primary Examiner*—David P Porta
*Assistant Examiner*—Mindy Vu
(74) *Attorney, Agent, or Firm*—Eric A. Gifford

(57) ABSTRACT

An array of microlenses magnifies the effective negative luminescence regions of a sparsely populated NLCS so that the NLCS appears cold to a FPA. This approach reduces the total diode area with minimal effect on device processing. The microlenses are fabricated on the backside of the substrate away from the devices, either prior to or after device processing. This ensures high quality devices that maintain NL efficiency without negatively impacting power consumption.

24 Claims, 11 Drawing Sheets

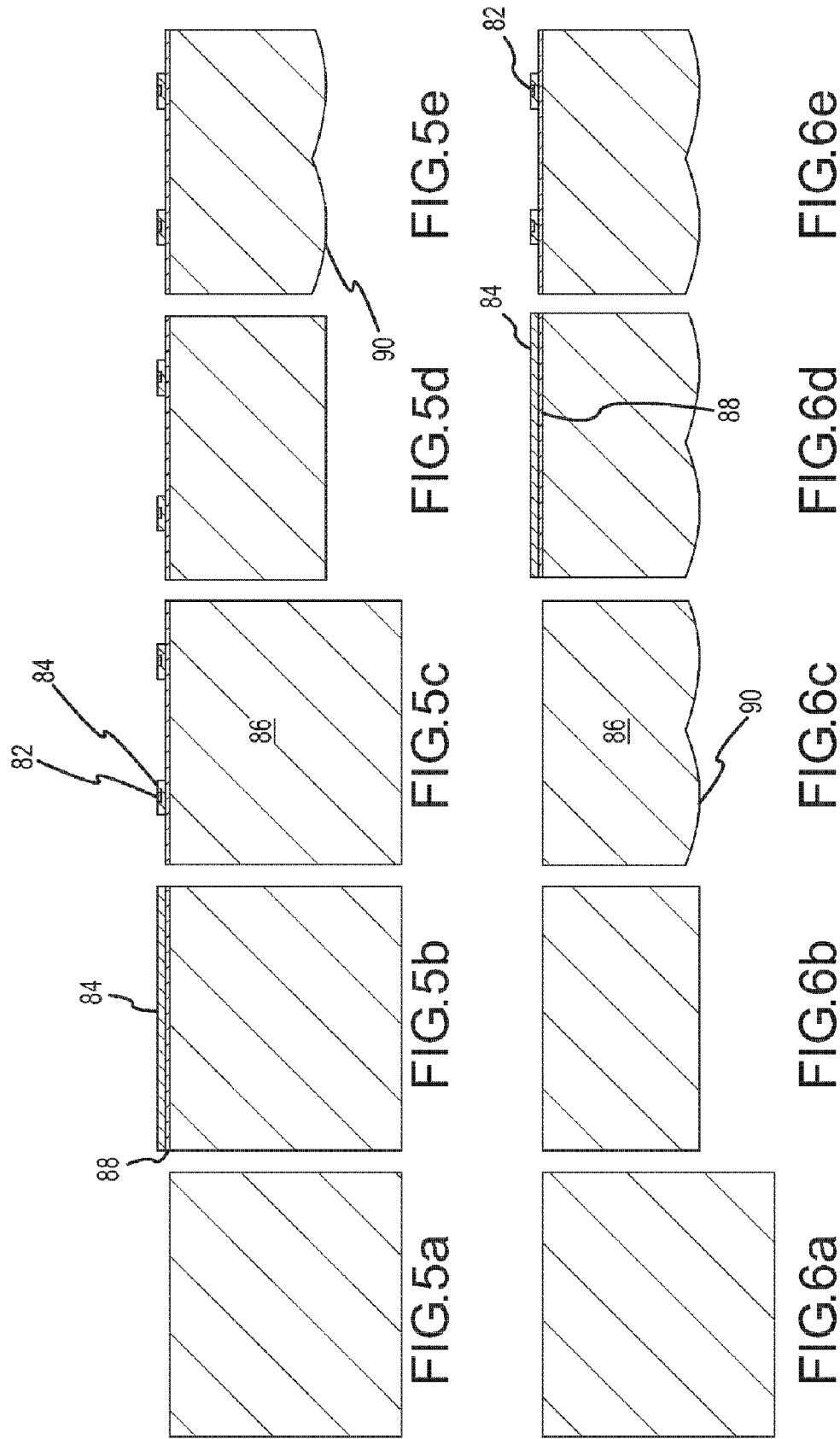

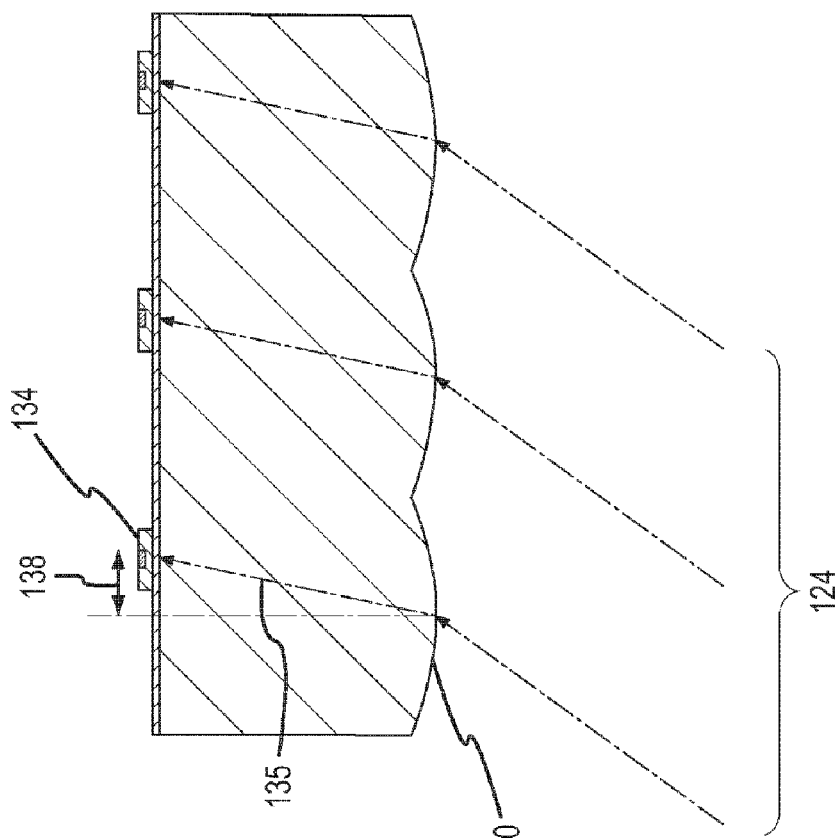
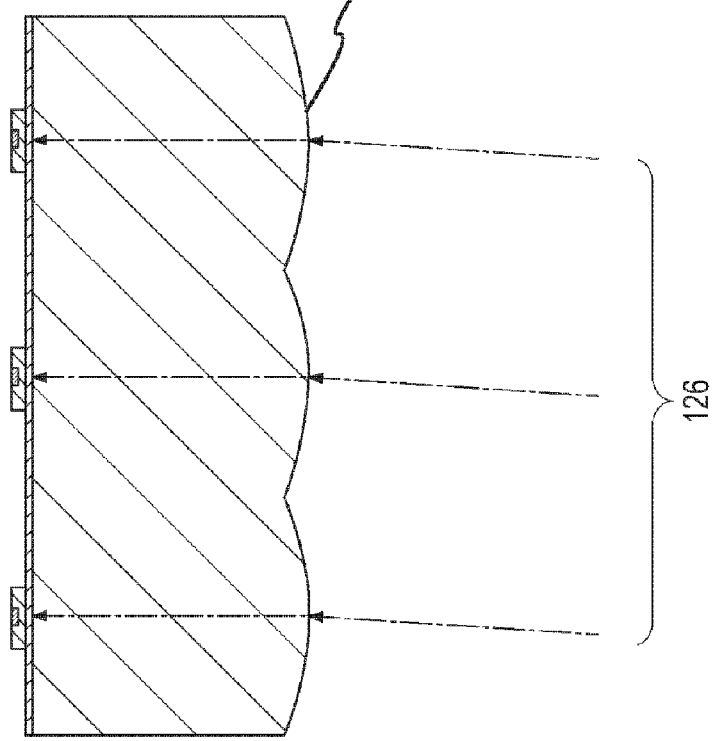
FIG.8b

NEGATIVE LUMINESCENCE COLD SHIELD (NLCS) WITH MICROLENSES TO MAGNIFY THE EFFECTIVE AREA OF SPARSELY POPULATED NEGATIVE LUMINESCENCE REGIONS AND METHOD OF FABRICATION

FIELD OF THE INVENTION

This invention relates to cold shields for IR focal plane arrays (FPAs) and more specifically to the use of microlenses to magnify the effective area of sparsely populated negative luminescence regions in a negative luminescence cold shield (NLCS).

DESCRIPTION OF THE RELATED ART

All objects, because they are warm (at ambient or room temperature), emit large amounts of thermal radiation in the infrared (IR) spectral regions; and what they do not emit they reflect from their warm surroundings. Because the atmosphere is transparent in two of these IR regions, the MWIR region (~3 µm to ~5) and the LWIR region (8-14 µm), these regions may be used conveniently for IR or "thermal" imaging by IR focal plane arrays (FPAs). IR FPAs serve mainly to sense the small differences in thermal radiation intensity from an ambient temperature scene by converting to electrical signals those incident scene photons focused on the FPA by the system optics. To do this with high sensitivity, these devices typically operate at temperatures well below the surrounding ambient. The system optics subtend only a small portion ($\frac{1}{5}^{th}$ to $\frac{1}{400}^{th}$) of the total hemispherical field of view of the FPA. Without appropriate shielding the remainder of the field of view at ambient temperature will irradiate the FPA with unwanted photons, creating excess noise and, potentially, saturating its output.

As shown in FIG. 1, an IR imaging sensor system 10 includes optics 12 that focus scene photons 13 (emitted or reflected) through a Dewar window 14 onto a FPA 16 in a Dewar (vacuum enclosure) 18. A "cold shield" 20 removes the unwanted photons such as photons 22 reradiated from the Dewar wall or photons 24 outside the system optics. For the simplest systems, the cold shield subtends a wider angle than the optics because the cold shield is not in the optics plane. More complicated "re-imaging" systems can place an image of the optics in the plane of the cold-shield opening eliminating much of the flux generated by the photons 24 outside the system optics. The cold shield is typically a blackened metal container surrounding the FPA to block the unwanted radiation from the ambient-temperature environment. A system cooler 26 holds the cold shield and FPA temperatures far enough below ambient temperature so that its own thermal radiation contributes negligibly to that incident on the FPA.

Cold shields are essential to operation of high-sensitivity IR FPAs, but their need for cooling (both because they must be cold not to radiate significantly and because they themselves, being large, absorb radiation from the outside which must be extracted through the inefficiency of the system cooler) and awkward size and shape typically complicate packaging and system optics adding substantially to cost and size, and possibly power. The cold shield's extra thermal mass reduces cooling rate. The most important performance figure of merit is the "cold-shield efficiency" which is the percentage of unwanted photons removed by the cold shield. For simple systems, this may be only 80-90% and may actually limit the system performance.

Recently, negative luminescence (NL) has been observed in some materials. NL is the reduction of equilibrium thermal radiation in the energy range above the semiconductor band gap caused by reducing below equilibrium the concentration of minority carriers whose recombination causes this thermal radiation. Typically, a reverse-biased diode placed in a semiconductor so that the diffusion length of minority carriers is longer than the distances from the diode to the boundaries of the material provides the NL effect. The term "diode" is used throughout to refer to either a P/N or N/P diode operated in reverse bias to induce negative luminescence in a region or portion of a region of a negative luminescence semiconductor material. This geometry can be readily obtained in thin film semiconductor crystals grown epitaxially on transparent substrates (although they can also be obtained by a thinned semiconductor glued or otherwise bonded to a transparent substrate). These substrates are typically coated by standard broad-band anti-reflection (AR) coating to minimize reflection from the ambient scene. Thin film semiconductors of this general type are commonly used to fabricate the detector arrays used in IR FPAs. Broad-band AR coatings are also standardly known and used in IR FPA technologies.

Thus, NL in an ambient-temperature semiconductor will cause the semiconductor to appear cold to an FPA sensitive only to photons of higher energy than the NL semiconductor band gap. The conventional cold shield described above may therefore be replaced entirely or partly by an ambient-temperature NL cold shield (NLCS) [FIGS. 2a, 2b]. The NLCS consists of an area of semiconductor with a diode or diodes [FIGS. 3a-c] arranged to produce the NL effect over all or most of the field of view of the FPA outside the optics. Because it operates at ambient temperature, the high-efficiency (>90%) NLCS can greatly simplify optics packaging, thus lowering cost and size while preserving performance.

As shown in FIG. 2a, cold shield 20 has been entirely replaced by multiple NLCSs 30 (shown in cross-section) that are positioned to surround the FPA to shield it from photons 22 that are radiated from the Dewar or photons 24 that pass the optics. As a result, the FPA sees a "cold" hemisphere everywhere except the angle subtended by the system optics 12.

As shown in FIG. 2b, cold shield 20 has been replaced with a short traditional cold shield 40 that shields radiation from a Dewar 42 (also shortened) and an annular NLCS 44 surrounding the optics 12, that shields scene photons that lie within the angle 46 subtended by the traditional cold shield 40 and outside the angle 48 subtended by the optics 12. As a result, the FPA sees a "cold" hemisphere everywhere except the angle subtended by the system optics 12.

As shown in FIG. 3a, an embodiment of a NLCS includes layers 52 and 54 of P-doped and N-doped IR semiconductor materials, respectively, on an IR transparent substrate 56. The doped layers form a large area diode 58 in a semiconductor in which the diffusion length of minority carriers is longer than the distances from the diode to the boundaries of the material to provide the NL effect. NL in an ambient-temperature semiconductor will cause the semiconductor to appear cold to an FPA sensitive only to photons of higher energy than the NL semiconductor band gap.

The principal drawback to this NLCS is the high power consumption of the ambient-temperature, large-area (typically >6 cm$^2$) semiconductor device needed to provide efficient shielding (or partial shielding, if used in conjunction with a small, relatively convenient conventional cold shield). Power consumption is proportional to the required bias voltage and bias current applied to the diodes. Best demonstrated performance reported to date (>95%) for a MWIR cold shield material (see for instance Lindle, et. al., IEEE Journal of Quantum Electronics, vol. 41, page 227[2005]) requires currents and voltages corresponding to ~3 watts power for a 6 cm² device. It would be highly desirable to reduce this value by at least a factor of 10. Greater reductions would allow larger devices giving more flexibility in their use. However, to obtain the high efficiency needed requires the NLCS semiconductor material and device quality to be excellent. Any process used to reduce NLCS power must still preserve NCLS device quality to be useful.

Typically, reducing power requires reducing the current required to operate the cold shield at a given voltage bias. A portion of diode currents is typically proportional to the total diode dimensions (area and/or perimeter, depending on the technology). One approach to reducing power consumption is to make the diode area (and perimeter) smaller by counting on lateral diffusion of minority carriers from charge neutral regions to the sides of an array of small diodes that only fractionally fill the semiconductor area. As shown in FIG. 3b, P-doped regions 60 are selectively formed in an N-doped layer 62 on a substrate 64 to define multiple diodes 66. This reduces any excess currents associated with the diode fabrication process—especially those that may be due to imperfections in the semiconductor material, imperfections that generally contribute high currents much more when they are located in the high-field region at the interface of the p and n regions of a diode. Thus, reducing the total area of these interfacial regions proportionately reduces the likelihood of including a current-enhancing defect. However, because the minority carriers need to diffuse farther to get to the now more remote junction, some of them may recombine by radiative or other mechanisms before reaching the diode, thus the NL efficiency may be degraded unless the individual diodes are placed within a minority carrier diffusion length of each other.

Some [e.g. Nash et al., IEEE Proc. Optoelectron. 150, 371 (2003)] have indicated that using a focal concentrators 70 such as conventional or Winston cones [the latter being a paraboloid of revolution about an axis offset from the primary axis of the parabola to minimize cone height, see Welford, W. T. and Winston, R., The Optics of Nonimaging Concentrators (New York, Academic Press, 1970)] could be used to reduce the total area of the biased diode by a significant factor (>5) [FIG. 3c]. Instead of relying solely on lateral diffusion to make the entire area appear cold, this approach allows a sparse distribution of negative luminescence regions 75, which include the diode 72 and the surrounding semiconductor 74 associated with each concentrator. The area of each negative luminescence region 75 is effectively magnified to produce the appearance of a continuous cold region over the entire NLCS. However, these concentrators 70, into which the diodes must be built, require deep, precisely shaped mesa architectures etched through the semiconductor material 74 and into the substrate 76 without degrading the high device quality required for high NL efficiency. Such three dimensional architectures greatly complicate semiconductor processing and may compromise NLCS performance. Moreover, unless the base of the cones is very large, diffraction will spread the light from the collectors into an angle equal to 2.44 times the optical wavelength divided by the cone base diameter and by the refractive index of the cone medium. For 5 µm radiation, this angle is on the order of 0.05-0.06 radians or about 3 degrees. This diffractive spreading reduces the NL efficiency at the FPA, and may need to be offset by deeper, larger a focal concentrators to insure that the spreading does not render the percentage of radiation suppression inadequate at the FPA.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a cost-effective NLCS and method of fabrication for reducing the total diode area with minimal effect on device processing. This is accomplished with an array of microlenses on the backside of a semiconductor substrate transparent to thermal IR radiation whose front side is sparsely populated with negative luminescence (NL) regions. Each region contains an IR absorbing semiconductor with one or more diodes to produce the negative luminescence within the IR semiconductor material. These regions may, for example, be formed using an epitaxial structure or by mounting a thinned NL semiconductor on a substrate. Each microlens, properly positioned and sized, creates a magnified image at the FPA of the relatively small NL region corresponding to that microlens. From the point of view of the FPA, this magnified image makes each microlens and the entire microlensed area of the substrate appear cold.

The microlenses are fabricated on the backside of the substrate away from the devices, preferably prior to or after device processing, and thus the microlenses and their fabrication have minimal negative effect on device processing. This ensures high quality devices that maintain NL efficiency without excessive power consumption. To further simplify processing, the microlenses may be fabricated with a planar or "Fresnel" geometry, thus reducing the required etching depth.

The NLCS is designed and configured to cover the solid angle outside the incident optics and not otherwise cold-shielded by a conventional cold shield. The microlenses are preferably designed and arranged so that their images of their NL regions cover only a predetermined solid angle occupied by the FPA thereby reducing the diode area required for the NLCS and thus reducing the power required for its use.

In one approach, the NLCS is segmented into 'tiles' whose typical width is small compared to their distance from the FPA (whose typical width is also assumed small compared to this distance). Each tile is arranged substantially perpendicular to the line connecting the optical center of the FPA to the center of the NLCS tile. In another approach, the microlenses may be formed in the planar surface of a single large tile that subtends a sufficiently large radial angle as seen from the FPA. In this case the microlenses are shaped and/or positioned with respect to their corresponding NL regions differently depending on the angle formed between the normal to the substrate surface in which the microlens is formed and the line connecting the center of the microlens to the center of the FPA. The microlenses are shaped so that each microlens's chief ray from the center of the FPA or solid angle containing the FPA is directed by the microlens to the center of its corresponding negative luminescence region. Combinations of tiling, shaping and positioning approaches may also be used to optimize the NLCS performance for a given system.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 5a-5e and 6a-6e are diagrams illustrating alternate fabrication sequences for the NLCS and microlens array;

FIGS. 8a and 8b illustrate an embodiment of a NLCS in which the shape and position, respectively, of the microlenses are configured to image only the FPA.

DETAILED DESCRIPTION OF THE INVENTION

The present invention provides a cost-effective NLCS and method of fabrication for reducing the total diode area with minimal effect on device processing.

Figure 1:
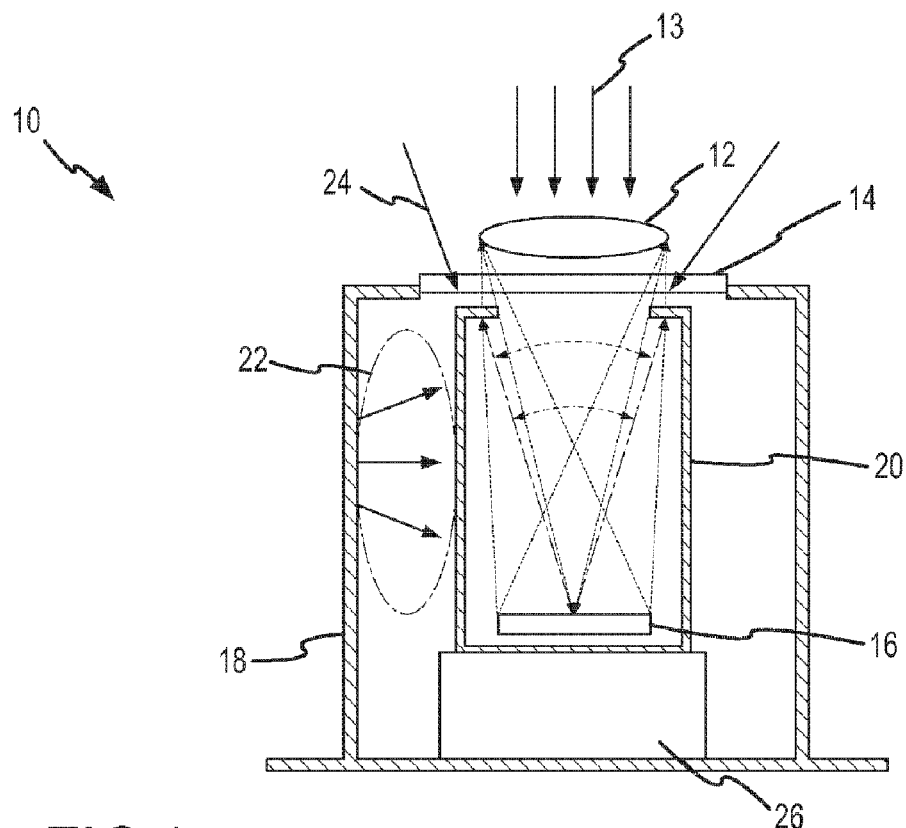
FIG. 1, as described above, is a diagram of a conventional cold shield for an IR FPA.
Figure 2A:
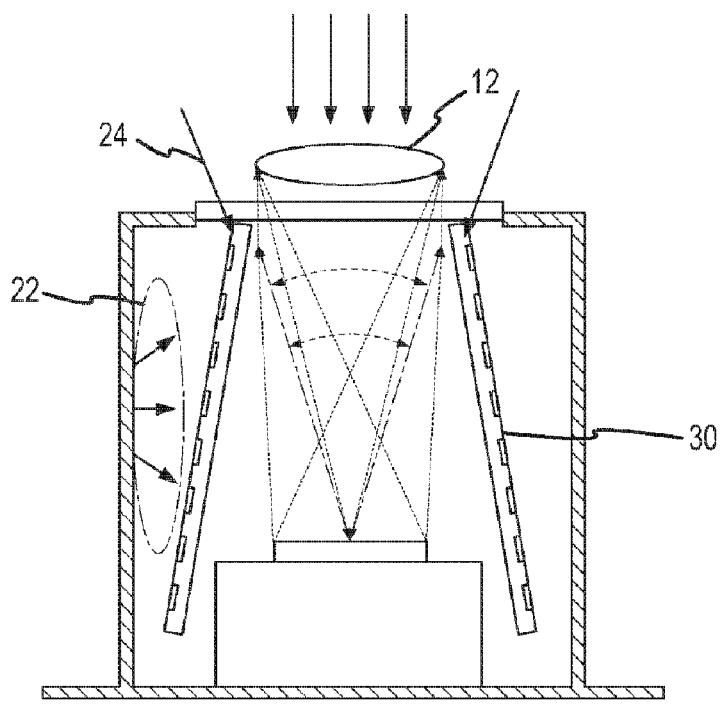
FIGS. 2a and 2b, as described above, are diagrams of a negative luminescence cold shield (NLCS) used in place of a conventional cold shield and in combination with a shortened conventional cold shield, respectively.
Figure 2B:
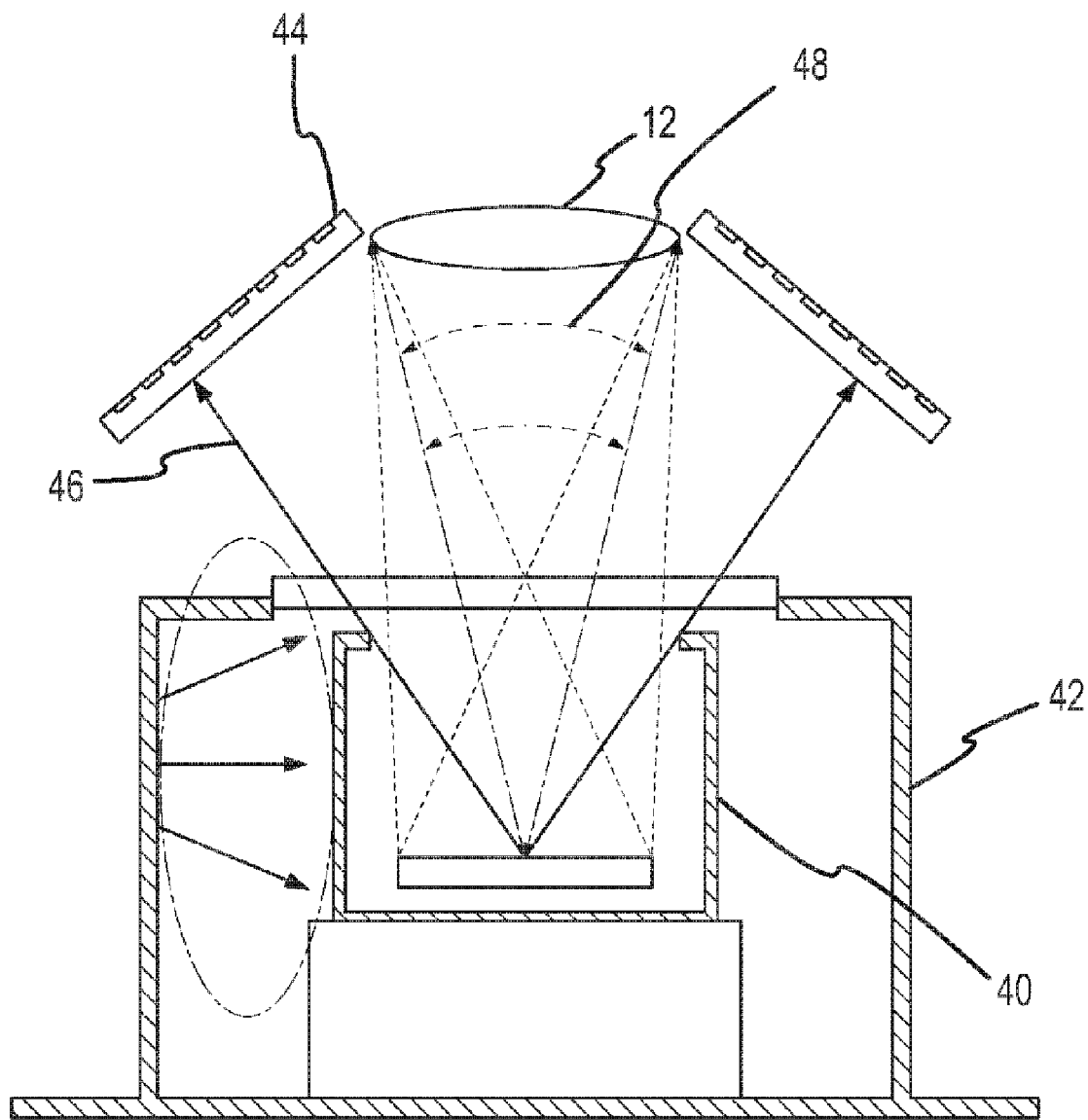
Figure 3A:
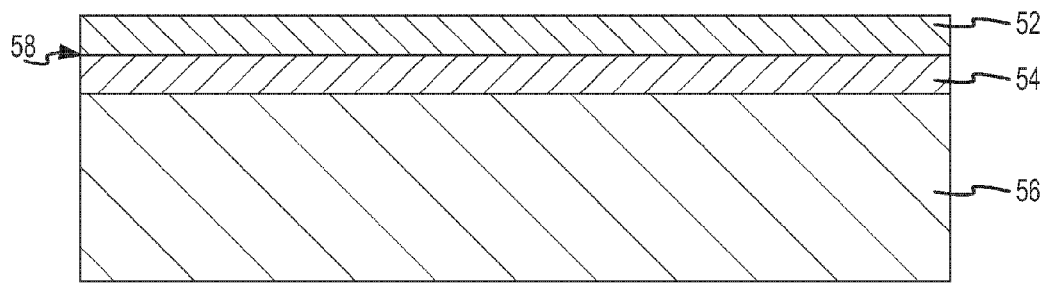
FIGS. 3a-3c, as described above, are section views of known NLCS diode architectures.
Figure 3B:
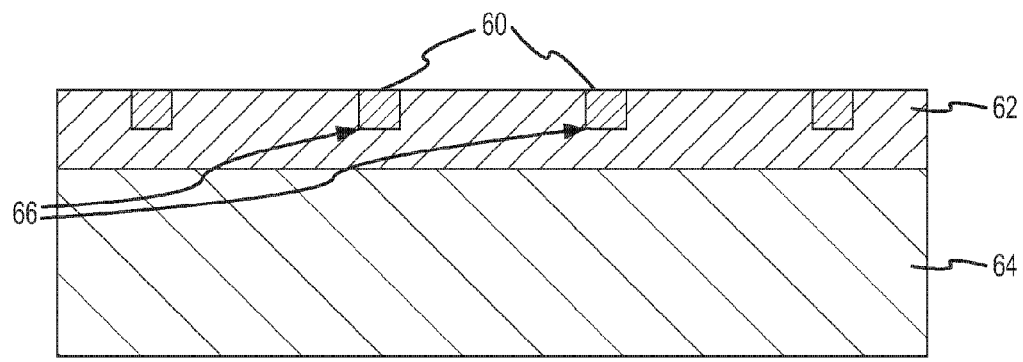
Figure 3C:
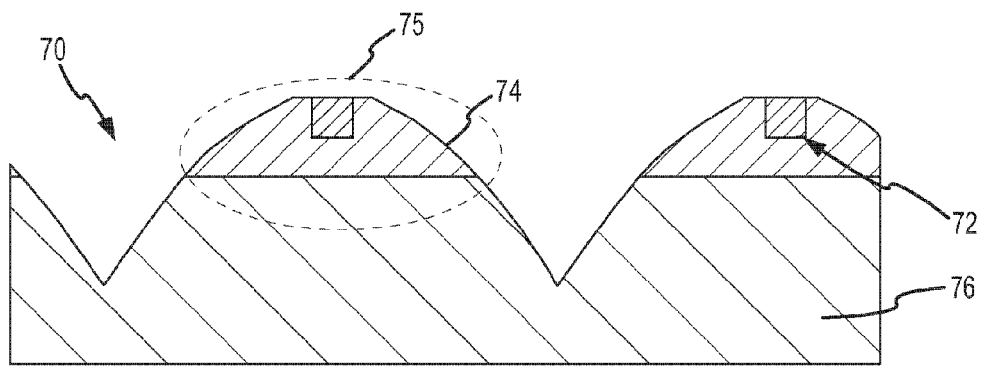
Figure 4A:
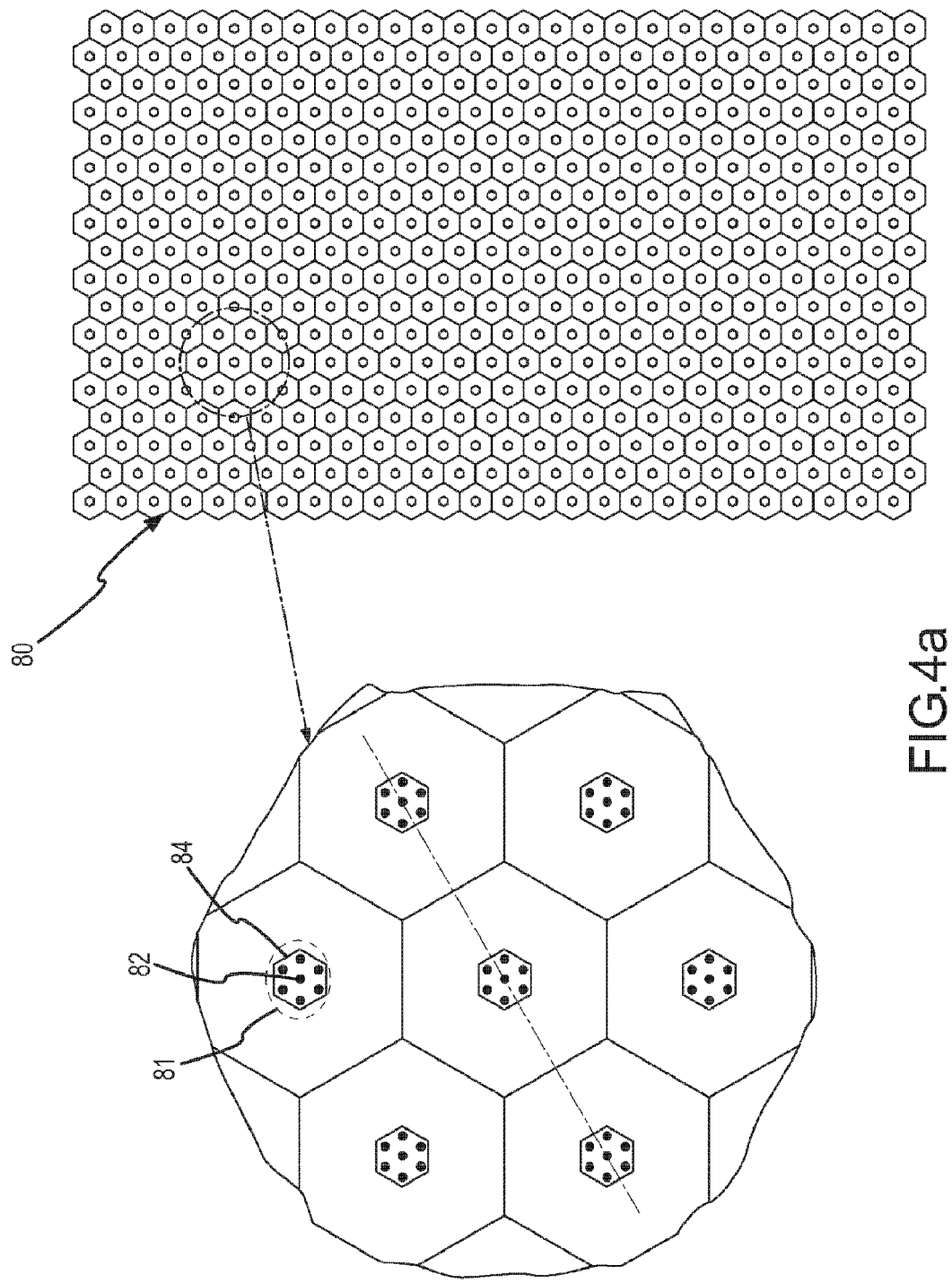
FIGS. 4a-4b are plan and section views of a sparsely populated NLCS and microlens array for magnifying the effective size of the NL regions as seen by an FPA.
Figure 4B:
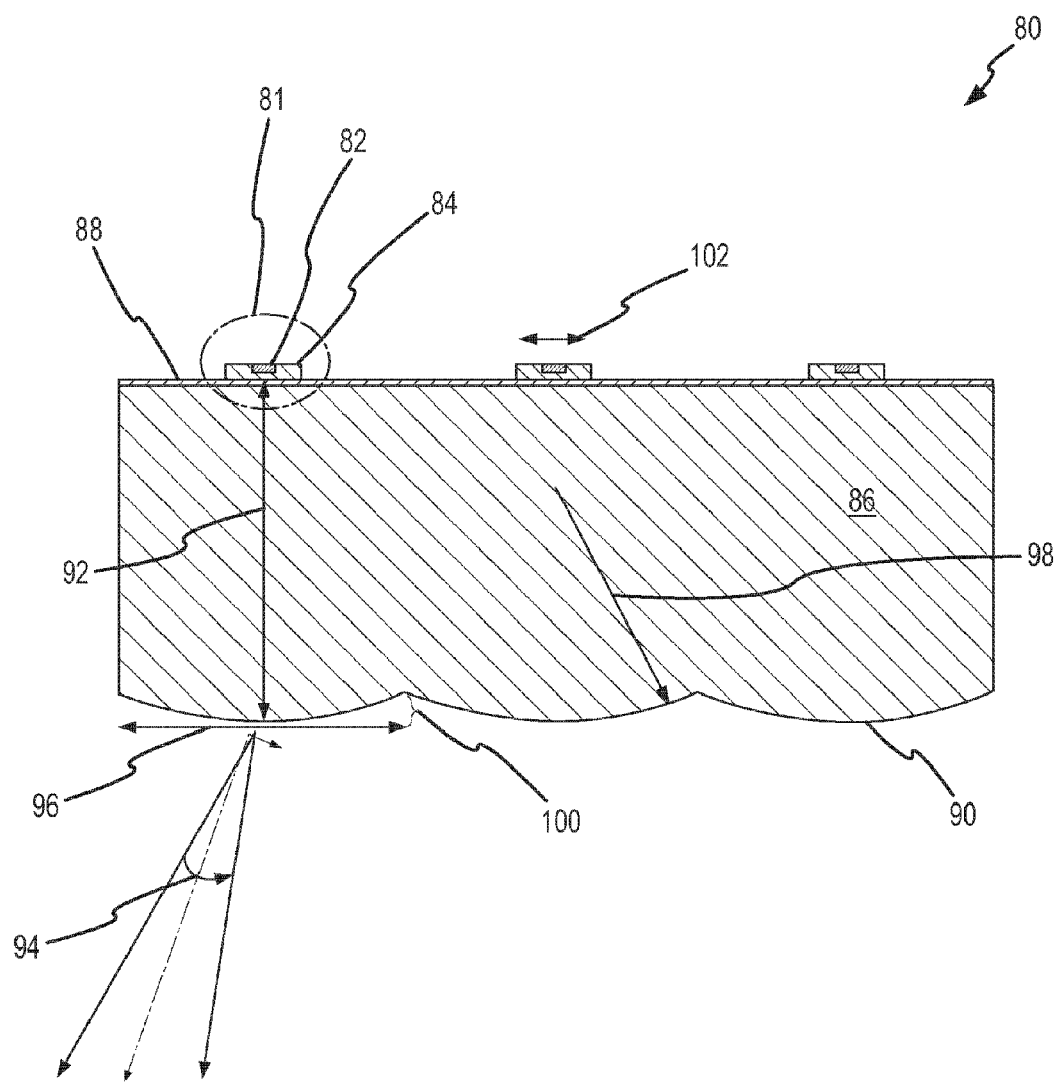

As shown in FIGS. 4a and 4b, a NLCS 80 is sparsely populated with NL regions 81, each region consisting of one or more diodes 82 formed in NL semiconductor material 84-, e.g. MWIR or LWIR HgCdTe, InSb, PbSnTe, PbSnSe, InAsSb, MWIR or LWIR strained layer superlattice semiconductors, or any of a variety of MWIR and LWIR semiconductors known to those in the art, on an IR transparent substrate 86 with a refractive index n, suitably 2.7 to 4. The NL semiconductor material has a refractive index near that of the substrate sufficient to minimize interfacial reflections, <2% being typical. These NL regions may, for example, be formed using an epitaxial structure or by mounting a thinned NL semiconductor on a substrate.

The NL regions 81 are connected across the NLCS by a conducting layer 88 comprised preferably of a wider band gap semiconductor of the same carrier type as the NL semiconductor material, but whose band gap is at higher energy than the NL semiconductor and is thus transparent to thermal radiation. Alternatively this conducting connection among NL regions may be facilitated by a metal line or sheet which is individually connected to each NL region through a contact in the region. A combination of conducting semiconductor and conducting metal may also be used. It is also possible that the substrate, itself, could be of the appropriate conductivity magnitude and type (the same as the semiconductor) and provide the electrical connection among the NL regions.

An array of microlenses 90 on the backside of NLCS substrate 86 magnifies the effective area of diodes. In typical configurations, the substrate is thinned to the focal length (ST) 92 of the microlenses. Each microlens, properly positioned and sized, creates a magnified image at an FPA of the relatively small NL region corresponding to that microlens. From the point of view of the FPA (or whatever solid angle is desired to be cooled), this magnified image makes each microlens and the entire microlensed area of the substrate appear cold.

The integration of the microlens array allows the substrate to be sparsely populated with NL regions. The smaller the total diode area of the device the lower the chance of defects, hence the lower the power consumption. Also, the smaller the total NL region of the device (and the diodes it contains), the smaller the total non-defect-related dark current and the lower the power consumption. Sparseness is a property of both the size of each NL region and the distance between NL regions and will depend on the design of a particular NLCS and the IR imaging system in which it is incorporate. Within each NL region, the diode or diodes providing the NL may themselves be sparsely distributed, that is having a substantially smaller area than the NL region. Diode sparseness (the fraction of NL region covered by a diode area) multiplies the NL region sparseness (the fraction of the NLCS covered by NL regions) and reduces defect currents. The smaller these diode and NL fractions the greater the reduction in diode currents required to operate the NLCS. The system benefit will increase in proportion to the inverse of these fractions which in turn will depend on the particular technology and designs used. Diode sparseness within the NL region reduces some defect currents associated with each technology used, but the most fundamental diode currents come from and are proportional to the area of the NL region containing the diode. Therefore, NL region sparseness is the fundamental benefit realized by the microlenses. Its measure is the concentration ratio—the ratio of the total NLCS area to the total NL region area—this is the same as the ratio of the average microlens area to the average area of the NL region associated with a microlens. The current required to run the NLCS will be reduced by at least this concentration ratio.

The basic design considerations for microlens use, in the case where the microlens is circular and lies in a plane perpendicular to the line between the center of the microlens and the center of the FPA, can described by the following terms and equations as illustrated in FIGS. 4a and 4b:

Outside Angle (in deg)=OUTA 94=outside angle subtended by FPA approximately bisected by normal to region of microlenses surface Wavelength =lam Refractive index=n Microlens focal length (also substrate thickness)=ST 92

Microlens Diameter=DM 96

F no of external optics=FEX=$1/(2*TAN(\pi*OUTA/180))$

Microlens Diffraction Blur=BD=$2*lam*ST/(n*DM*(1-EXP(-2*lam*FEX/DM)))$

Microlens FOV Blur=BF=$ST*TAN(ASIN(SIN(ATAN(\frac{1}{2}/FEX))/n))$

Microlens Radius=RL 98=$ST*(n-1)/n$

Concentration Ratio (power reduction factor)=CR=$(DM/(BD+BF))^2$

Sag height=SH 100=$DMA^2/8/RL$

NL region width=W 102=(BD+BF)

As shown in FIG. 4a, the microlenses typically would have a hexagonal, rather than circular shape to fill completely the area of the NLCS. However, the analysis developed for a circular lens is nearly correct for a hexagonal lens and will be assumed the same for this discussion.

As shown in FIG. 4b, the microlenses 90 are fabricated on the backside of the substrate 86 away from the NL regions 81 with their diodes 82, preferably prior to or after device processing, and thus the microlenses and their fabrication have minimal negative effect on device processing. Methods to deposit microlenses on substrates of semiconductor devices are known to those working in the art. A representative technique for forming microlenses on a substrate is described in H. O. Sankur and M. E. Motamedi, "Microoptics Development in the past decade", Micromachinging Technology for Micro-Optics, Proceedings of SPIE Vol. 4179 (2000), pp. 30-35, which is hereby incorporated by reference. To further simplify processing, the microlenses may be fabricated with a planar of "Fresnel" geometry, thus limited the required etching depth. This ensures high quality devices that maintain NL efficiency without negatively impacting power consumption.

FIGS. 5a-5e and 6a-6e describe two variants of the basic process sequence for microlensed NLCS fabrication. In one approach shown in FIGS. 5a-5e, device processing is performed first to form the diodes 82 in the sparsely populated regions of negative luminescence semiconductor material 84, e.g. diodes made from local P-type doping (using techniques well known in the art) in the N-type regions of semiconductor material, on conducting layer 88 on substrate 86 (FIGS. 5a-5c). Thereafter, substrate 86 is suitably thinned to the focal distance of the microlenses (FIG. 5d). Typically the substrate will require thinning to the desired thickness but it is possible that the blank substrate is the desired thickness so that thinning is not required. Lastly, the array of microlenses 90 is formed on the backside of the substrate (FIG. 5e). Because the microlenses are applied to the opposite (back) side of the NL structure from the side processed for diodes, their application and presence has little effect on diode quality.

In another approach shown in FIGS. 6a-6e, the microlenses 90 are fabricated on the back side of the unprocessed substrate 86. The substrate is first suitably thinned to the appropriate thickness (microlens focal distance) and the microlenses formed thereon (FIGS. 6a-6c). Thereafter NL semiconductor material 84 is grown on conducting layer 88 on the other side of the IR transparent substrate and processed to form diodes 82 (FIGS. 6d-6e).

Compared to a focal concentrators, the fabrication of microlenses on the backside of the NLCS is easier, cheaper and more likely to provide the high quality devices needed for high NL efficiency and low power consumption required of a sparsely populated NLCS. Other intermediate versions of the process sequence (in which microlenses are processed, for example, after the NL material deposition, but before diode processing) will occur to those skilled in the art and may be adapted to suit the materials and process techniques of the particular diode technology used.

Figure 7:
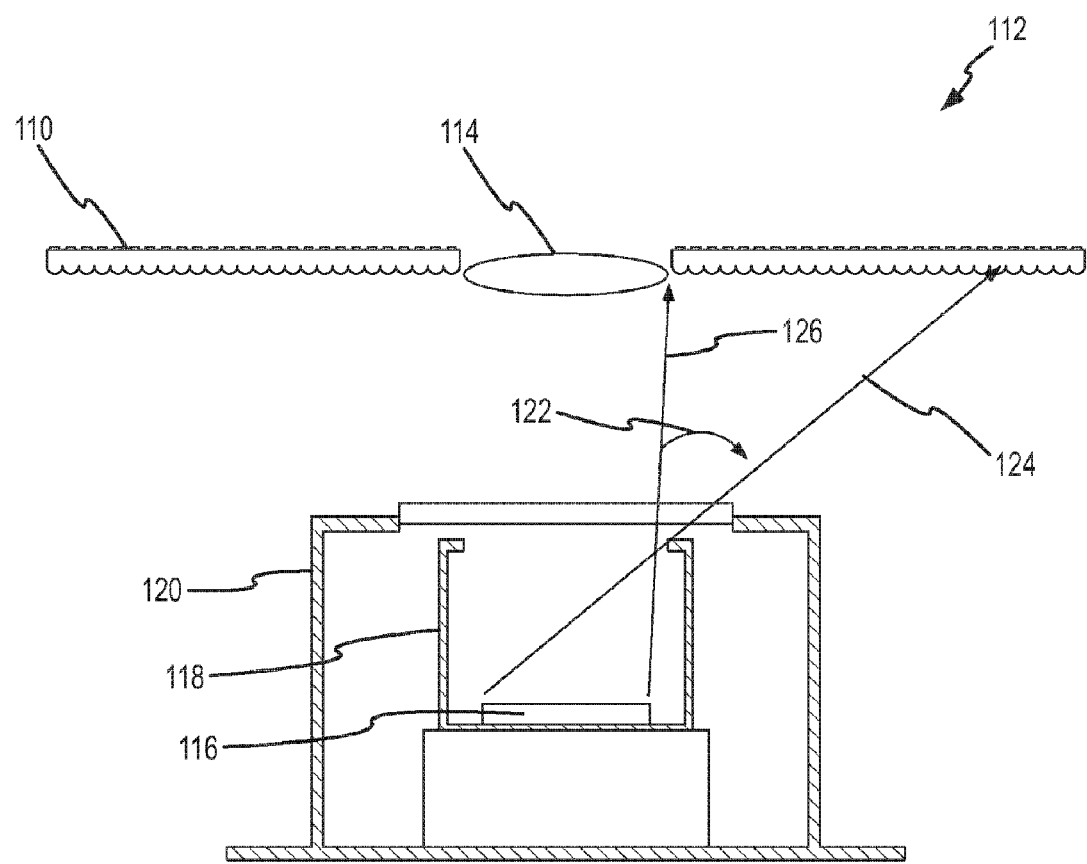
FIG. 7 is a diagram of a microlensed NLCS used in combination with a conventional cold shield.

As shown in FIG. 7, a microlensed NLCS(s) 110 will typically be designed and fabricated for a particular IR imaging sensor system 112 including incident optics 114 and an FPA 116 and a conventional cold shield 118 inside Dewar 120. The NLCS(s) are designed to cover the solid angle 122 outside the incident optics 114 that are not otherwise cold-shielded by the conventional cold shield 118. In other words, the microlenses are designed to image their respective NL regions onto the FPA. If the NLCS(s) do not cover a large enough solid angle, the FPA will not be effectively shielded. Conversely, if the NLCS(s) cover too much of the solid angle, the NL regions of the NLCS will be unnecessarily large or dense, which increases the required total diode area and correspondingly increases power consumption. Therefore, the microlenses are preferably designed so that the images of the NL regions cover only a predetermined solid angle occupied by the FPA. In other words, for an optimal NLCS, to insure effective shielding the image of the solid angle is fully contained within the NL region associated with each microlens, but to minimize power consumption the NL region is only just large enough to contain this image. In general, it is more important to insure effective shielding than to minimize power consumption, so the image of the solid angle containing the FPA should be contained within the NL region with as little excess NL region as reasonably possible. The degree of optimization will vary depending on the needs of the system.

As shown, different points on the cold shield have different angular views of the FPA where the most extreme ray 124 is incident at a relatively high angle, while the least extreme ray 126 is nearly normally incident on the NLCS 110. The microlens design equations presume that the microlens lies in a plane perpendicular to the line between the center of the microlens and the center of the FPA. The equations are satisfied for some deviation from perpendicular. However, if the incidence of the most extreme ray is too high the entire substrate will not appear cold to the FPA. One approach is to use a relatively tall conventional cold shield that limits the angle of incidence of the most extreme ray. Another approach is to increase the size and/or density of the NL regions. The former solution may be suitable in some systems but too bulky in others. The latter solution will increase the power consumption of the NLCS.

Figure 8A:
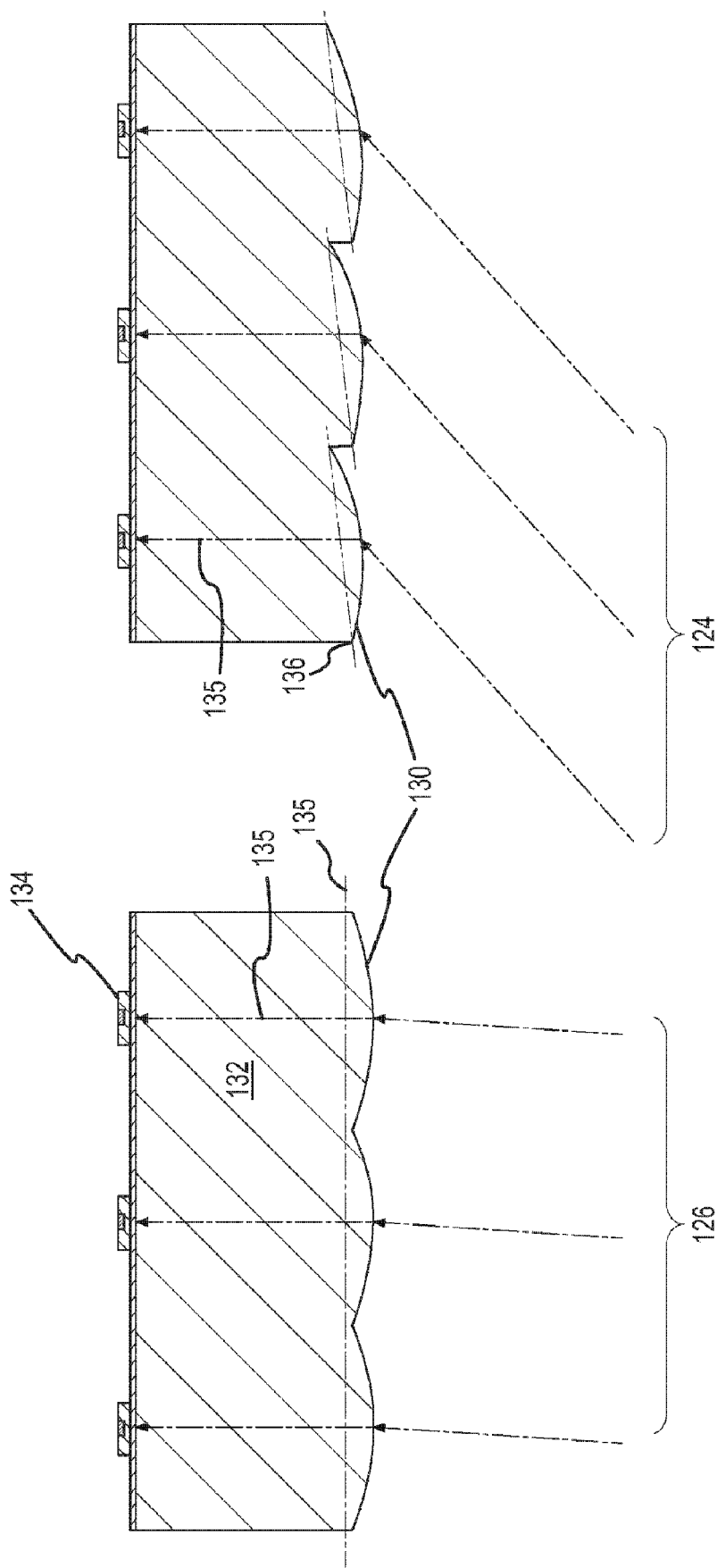

FIGS. 8a and 8b illustrate alternate approaches in which the microlenses 130 are formed in a planar substrate 132 and the shape of the microlenses and/or the positions of the corresponding NL regions 134 in different parts of the NLCS are tailored to compensate for the different position of the FPA as seen from the different parts of the NLCS. In this case the microlenses are shaped and/or positioned with respect to their corresponding NL regions differently depending on the angle formed between the normal to the substrate surface in which the microlens is formed and the line connecting the center of the microlens to the center of the FPA so that each microlens's chief ray from the center of the FPA (or its corresponding solid angle) 135 is directed to the center of its corresponding negative luminescence region 134. Note, the 'chief' ray is a ray directed towards the center of the entrance pupil of an optical system where the microlens defines the entrance pupil of the optical system in consideration. The effect of this tailoring is still to place the image of the FPA in the NL region corresponding to each microlens.

FIG. 8a shows how microlens shapes differing by region can direct the image of the FPA into the corresponding NL region. The microlens 130 in the region where the most extreme ray 124 hits the NLCS has a greater tilt 136 away from the incident ray compared to that where the least extreme ray 126 hits. The details of the shape will depend on the specifics of the system but can readily be worked out by appropriate lens design known to those of ordinary skill in the art of optical system design.

FIG. 8b shows how re-positioning the corresponding NL regions 134 for microlenses 130 in different parts of the NLCS will allow a constant shape microlens to direct the image of the FPA into its corresponding NL region. In this case the NL regions need to be shifted 138 by approximately the focal length times TAN(ASIN(SIN(angle to the FPA)/n)). The size of the NL region will need to be increased slightly to compensate for diffraction as the effective aperture of the microlens decreases with the angle to the FPA, for the defocusing that may occur for large angles, and for the increasing angle of the incident rays with respect to the plane of the NL region. Details of these adjustments will be understood by those having ordinary skill in the art of optical system design.

Figure 9A:
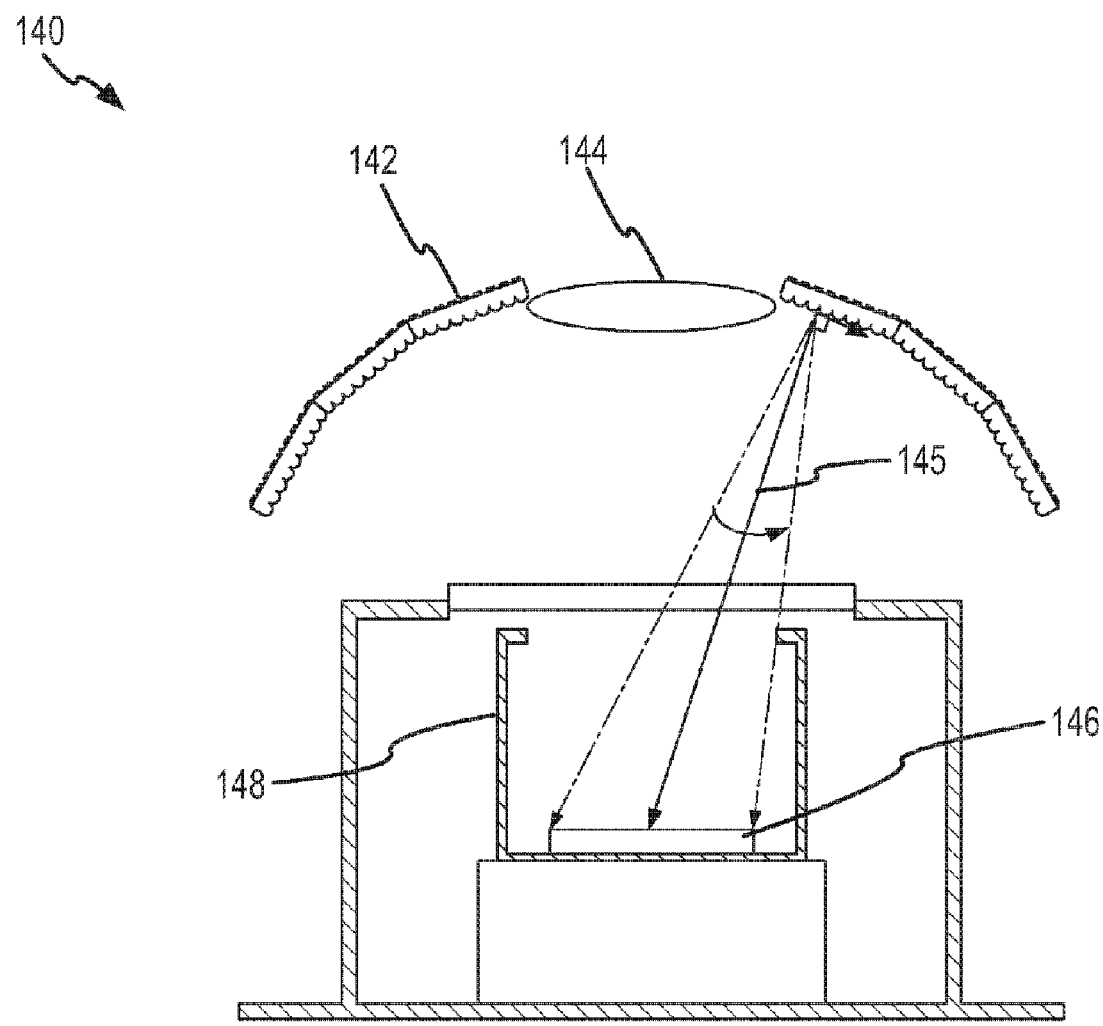
FIGS. 9a and 9b illustrate an embodiment of a 'tiled' NLCS configured to image only the FPA.
Figure 9B:
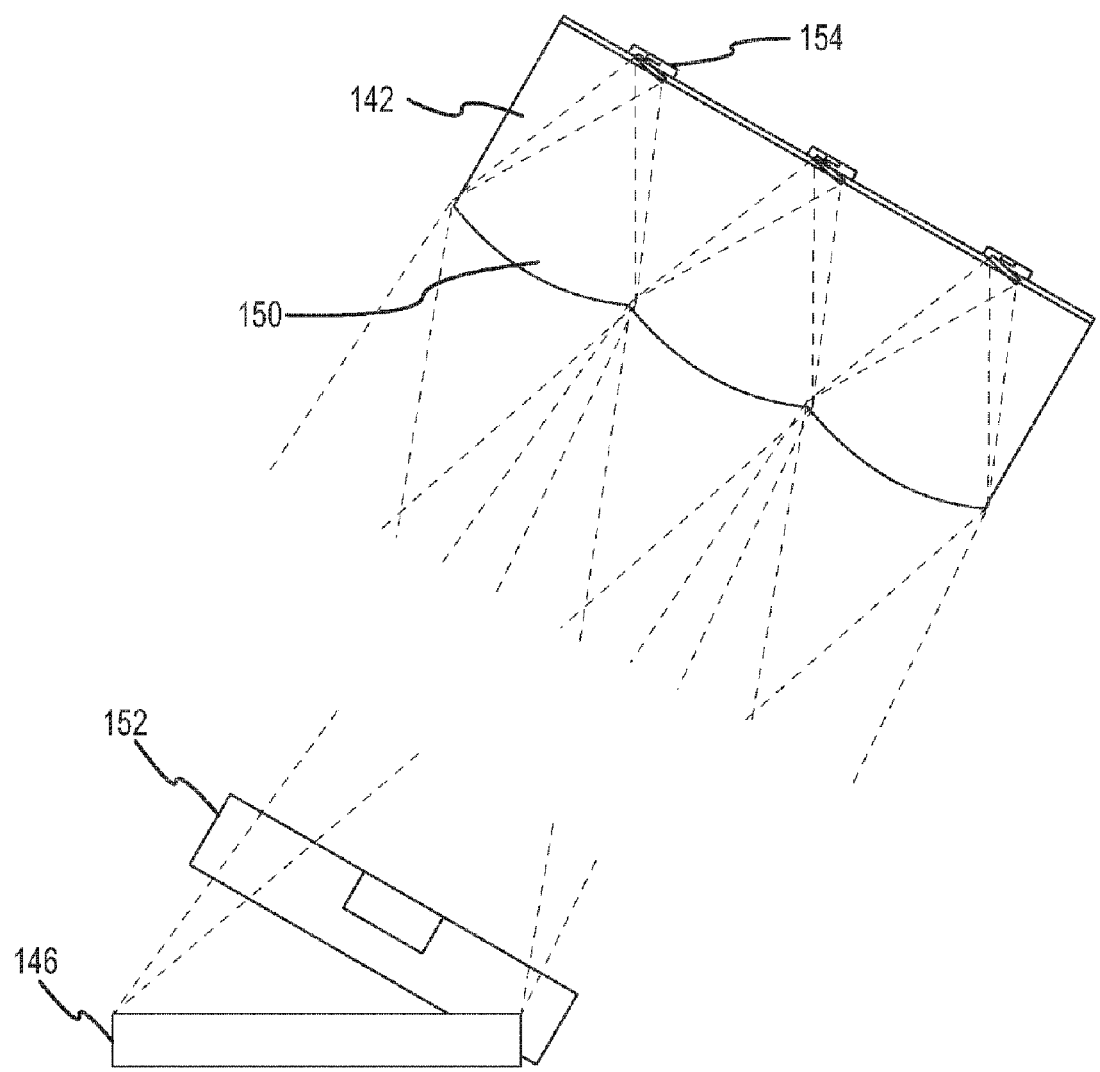

FIGS. 9a and 9b illustrate another IR imaging sensor system 140 in which a plurality of NLCS tiles 142 are arranged around the incident optics 144 so that each tile is substantially perpendicular to a line 145 connecting the center of each tile to the optical center of an FPA 146 or the solid angle it occupies. Each tile suitably includes multiple identically shaped microlenses and their aligned NL semiconductor regions. Each tile is assumed small enough so that the slight displacement among the microlenses within the tile does not invalidate the approximation that the microlenses in the region have optical axes that pass through the FPA center. As a result, this tiled configuration can handle arbitrarily large angles of incidence. In the extreme, the conventional cold shield 148 can be eliminated by forming the tiles in a hemisphere around the FPA. A conservative criterion would be, for example, that each tile subtends no more than a 10 degree arc (~0.024sr)

As shown in FIG. 9b, the microlenses 150 in each tile 142 are suitably designed and arranged so that an image 152 of the NL region 154 covers only the FPA 146, thereby reducing the diode area required for the NLCS and thus reducing the power required for its use. To insure this, the image 152 of the FPA should be completely contained within the NL region 154 of each microlens 150. There are a number of different strategies for insuring that this condition is attained. The shape and amount of tilt of each group of microlenses will depend on its position with respect to the FPA, the index, size, and focal length of the microlens, the FPA distance and size, the relative position of the diode associated with the microlens to the microlens, etc.

We note that in practice depending on the specific system optical configuration, a combination of tiled and tailored regions (both tailored microlens shape and tailored NL region position) may prove the best from a cost and performance standpoint. These three methods may be readily combined to suit the system need, as will be obvious to those familiar with the art.

In an exemplary embodiment, 15-40 tiles form the NLCS around the incident optics as shown in FIG. 9a. The exact number will depend on how high a conventional cold shield is acceptable. 15 tiles accounts for a relatively longer conventional cold shield (subtending to within a 0.34 radian angle of the central axis) and 40 tiles for a shorter one (subtending to within a 0.52 radian angle). A suitable MWIR NLCS microlens design would be: OUTA=10 degrees, lam=5.0 µm, n=3.3 (silicon substrate), ST=500 µm typical for silicon, DM=325 µm, FEX=2.8, BD=55.8 µm, BF=26.3 µm, RL=348.5 µm, CR=15.7 µm, SH=37.9 µm, and W=82.1 µm. The concentration ratio achieved by this configuration is similar to that for Winston cones with 30 µm height and 50 µm base diameter—a structure that will be very challenging to make without compromising diode quality and increasing fabrication cost. The diffraction from a 325 µm microlens is an angle equal to 2.44 times the optical wavelength divided by the microlens diameter or about 0.04 radians or about 2 degrees less than that of the Winston cone. One NL region of ~82 µm diameter is positioned at the focus of each microlens. The negative luminescence material is MWIR HgCdTe with a band gap wavelength greater than 5 µm so as to provide good optical absorption in the spectral region below 5 µm. Because the diffusion length in MWIR HgCdTe can be many tens of microns it is possible to obtain effective lateral collection from a few small diodes arranged in the NL region of each microlens. To minimize junction area each NL region could be populated with, for example, seven small junctions, nominally 7 µm in diameter with six diodes arranged symmetrically about a center diode and centered at a distance of 16 µm from the center of the center diode. Depending on material and process quality, these numbers could be adjusted to suit the design involved. Such adjustments should be straightforward to those versed in the IR semiconductor art, as are the numerous processes used to make high performance IR semiconductor diodes in HgCdTe and other relevant materials, any one of which could be suitably used for this invention.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

What is claimed is:

1. A negative luminescence cold shield (NLCS), comprising:
    an IR transparent substrate having first and second opposing surfaces;
    a plurality of negative luminescence (NL) regions of an IR semiconductor material sparsely distributed over the substrate's first surface, each said NL region containing a plurality of diodes to exhibit negative luminescence; and
    an array of microlenses on the substrate's second surface that magnify the effective size of corresponding NL regions.

2. The NLCS of claim 1, wherein the effective size of the NL regions is magnified so that a negative luminescence image of the plurality of NL regions covers substantially all of the microlensed area of the NLCS for a predetermined solid angle seen by an IR focal plane array (FPA).

3. The NLCS of claim 1, wherein the microlenses are designed and arranged so that a negative luminescence image of the plurality of NL regions covers substantially only a predetermined solid angle seen by an IR focal plane array (FPA).

4. The NLCS of claim 3, wherein the NLCS is segmented into a plurality of tiles that are arranged substantially perpendicular to a line connecting the center of each tile to the optical center of the predetermined solid angle, the microlenses on each said tile being differently positioned and/or shaped with respect to their corresponding NL regions as a function of the angle formed between a normal to the substrate's second surface and a line connecting the center of each microlens to the center of the predetermined solid angle so that the chief ray from the center of said solid angle to each of said microlenses is directed to the center of said microlens's corresponding NL region.

5. The NLCS of claim 1, wherein the microlenses are of a planar or "fresnel" geometry.

6. The NLCS of claim 1, wherein the substrate has a thickness approximately equal to the focal length of the microlenses.

7. The NLCS of claim 1, wherein the NL regions are formed of a negative luminescence semiconductor material and connected across the NLCS by a conducting layer formed of a metal or wider band a semiconductor material of the same carrier type.

8. A negative luminescence cold shield (NLCS), comprising a plurality of tiles that are arranged substantially perpendicular to a line connecting the center of each tile to the optical center of a predetermined solid angle so that a negative luminescence image of the plurality of tiles covers the predetermined solid angle, each tile comprising an IR transparent substrate having first and second opposing surfaces, a plurality of negative luminescence (NL) regions of an IR semiconductor material sparsely distributed over the substrate's first surface, each said NL region containing at least one diode to exhibit negative luminescence, and an array of microlenses on the substrate's second surface that magnify the effective size of corresponding NL regions.

9. A negative luminescence cold shield (NLCS), comprising:
- an IR transparent substrate having first and second opposing surfaces;
- a plurality of negative luminescence (NL) regions of an IR semiconductor material sparsely distributed over the substrate's first surface, each said NL region containing at least one diode to exhibit negative luminescence; and
- an array of microlenses on the substrate's second surface that magnify the effective size of corresponding NL regions, wherein the microlenses are differently positioned and/or shaped with respect to their corresponding NL regions as a function of the angle formed between a normal to the second surface and a line connecting the center of each microlens to the center of a predetermined solid angle so that a negative luminescence image of the plurality of NL regions covers a predetermined solid angle.

10. The NLCS of claim 9, wherein the chief ray from the center of the solid angle to the microlens is directed to the center of its corresponding NL region.

11. The NLCS of claim 9, wherein the tilt of the microlens increases as the angle increases.

12. The NLCS of claim 9, wherein the amount of lateral shift between a microlens and its corresponding NL region increases as the angle increases.

13. An IR imaging sensor system, comprising:
- An IR focal plane array (FPA);
- Incident optics that focus scene photons onto the FPA for an inner portion of a solid angle seen by the FPA;
- An actively-cooled cold shield that shields an outer portion of the solid angle seen by the FPA; and
- A negative luminescence cold shield (NLCS) comprising at least one diode in each of a plurality of negative luminescence (NL) regions on a front surface of an IR transparent substrate and an array of microlenses on a back surface of the substrate facing the FPA, said microlenses magnifying the effective size of the NL regions so that the images of the NL regions generated by the microlenses as seen by the FPA cover the solid angle between the inner and outer portions of the solid angle.

14. The IR imaging sensor system of claim 13, wherein the NL regions are formed of a negative luminescence semiconductor material and connected across the NLCS by a conducting layer formed of a metal or wider band gap semiconductor material of the same carrier type.

15. The IR imaging sensor system of claim 14, wherein the NLCS is segmented into a plurality of tiles that are arranged substantially perpendicular to a line connecting the center of each tile to the optical center of the FPA, the microlenses on each said tile being differently positioned and/or shaped with respect to their corresponding NL regions as a function of the angle formed between a normal to the substrate's back surface and a line connecting the center of each microlens to the center of the FPA so that the chief ray from the center of said FPA to each of said microlenses is directed to the center of said microlens's corresponding NL region.

16. The IR imaging sensor system of claim 14, wherein each NL region contains a plurality of diodes.

17. An IR imaging sensor system comprising:
An IR focal plane array (FPA); and
A negative luminescence cold shield (NLCS) segmented into a plurality of tiles that are arranged substantially perpendicular to a line connecting the center of each tile to the optical center of the FPA, each said tile comprising at least one diode in each of a plurality of negative luminescence (NL) regions on a front surface of an IR transparent substrate and an array of microlenses on a back surface of the substrate facing the FPA, said microlenses magnifying the effective size of the NL regions so that the images of the NL regions generated by the microlenses as seen by the FPA covers substantially all of the microlensed area of the NLCS.

18. An IR imaging sensor system comprising:
An IR focal plane array (FPA); and
A negative luminescence cold shield (NLCS) comprising at least one diode in each of a plurality of negative luminescence (NL) regions on a front surface of an IR transparent substrate and an array of microlenses on a back surface of the substrate facing the FPA, wherein the microlenses are differently positioned and/or shaped with respect to their corresponding NL regions as a function of the angle formed between a normal to the back surface and a line connecting the center of each microlens to the center of the FPA to magnify the effective size of the NL regions so that the images of the NL regions generated by the microlenses as seen by the FPA covers substantially all of the microlensed area of the NLCS.

19. IR imaging sensor system of claim 18, wherein the tilt of the microlens increases as the angle increases.

20. IR imaging sensor system of claim 18, wherein the amount of lateral shift between a microlens and its corresponding NL region increases as the angle increases.

21. A method of fabricating a negative luminescence cold shield (NLCS), comprising:
Providing an IR transparent substrate having first and second opposing surfaces;
Thinning the substrate to a desired thickness
Forming an array of microlenses on the substrate's second surface that magnify the effective size of corresponding negative luminescence regions; and
After the microlenses are formed on the second surface, forming at least one diode in each of a plurality of negative luminescence regions sparsely distributed on the substrate's first surface.

22. The method of claim 21, further comprising forming a plurality of diodes in each said negative luminescent region.

23. The method of claim 21, wherein the negative luminescence regions are formed of a negative luminescent semiconductor material, further comprising forming a conducting layer of a metal or a wider band gap semiconductor material of the same carrier type that connects the negative luminescence regions across the NLCS.

24. The method of claim 21, wherein the substrate is thinned to a focal length of the microlenses.

* * * * *